United States Patent
de Graauw et al.

(10) Patent No.: US 7,839,213 B2
(45) Date of Patent: Nov. 23, 2010

(54) AMPLIFIER ARCHITECTURE FOR POLAR MODULATION

(75) Inventors: Antonius J. M. de Graauw, Haelen (NL); Leon C. M. Van Den Oever, Rosmalen (NL)

(73) Assignee: NXP B.V., Eindhoven (NL)

( * ) Notice: Subject to any disclaimer, the term of this patent is extended or adjusted under 35 U.S.C. 154(b) by 89 days.

(21) Appl. No.: 12/440,946

(22) PCT Filed: Sep. 10, 2007

(86) PCT No.: PCT/IB2007/053647

§ 371 (c)(1),
(2), (4) Date: Mar. 12, 2009

(87) PCT Pub. No.: WO2008/032264

PCT Pub. Date: Mar. 20, 2008

(65) Prior Publication Data

US 2010/0156540 A1   Jun. 24, 2010

(30) Foreign Application Priority Data

Sep. 12, 2006  (EP) ................................. 06120519

(51) Int. Cl.
*H03G 3/20*  (2006.01)
(52) U.S. Cl. .......................... 330/136; 330/297; 330/10
(58) Field of Classification Search ................. 330/136, 330/297, 10
See application file for complete search history.

(56) References Cited

U.S. PATENT DOCUMENTS

| 5,276,912 | A | 1/1994 | Siwiak et al. |
| RE37,407 | E * | 10/2001 | Eisenberg et al. ............... 330/2 |
| 6,445,247 | B1 | 9/2002 | Walker |
| 7,043,213 | B2 * | 5/2006 | Robinson et al. .......... 455/127.2 |
| 7,202,734 | B1 * | 4/2007 | Raab .......................... 330/126 |
| 7,315,211 | B1 * | 1/2008 | Lee et al. ..................... 330/285 |
| 7,339,426 | B2 * | 3/2008 | Gurvich et al. .............. 330/136 |
| 7,474,149 | B2 * | 1/2009 | Snelgrove et al. ........... 330/136 |
| 7,542,741 | B2 * | 6/2009 | Rozenblit et al. ......... 455/127.2 |
| 2003/0112063 | A1 | 6/2003 | Kenington |
| 2004/0000948 | A1 | 1/2004 | Stengel et al. |
| 2004/0070449 | A1 | 4/2004 | Pekonen et al. |

FOREIGN PATENT DOCUMENTS

| EP | 0473299 A | 3/1992 |
| GB | 2356093 A | 5/2001 |
| WO | 0147127 A1 | 6/2001 |
| WO | 2004002006 A1 | 12/2003 |

* cited by examiner

*Primary Examiner*—Patricia Nguyen

(57) ABSTRACT

The present invention relates to an electronic device for power efficient linear amplification. The electronic device includes an amplifier (RF-PA) for amplifying a phase modulated signal (PM). The amplifier (RF-PA) is adapted to be controlled by a first modulating signal (AM high) for modulating the amplitude of the phase modulated signal (PM) above a predetermined amplitude value. The electronic device is further adapted to attenuate an output signal of the amplifier (RF-PA) for providing amplitude modulation below the predetermined amplitude value.

7 Claims, 4 Drawing Sheets

AMPLIFIER ARCHITECTURE FOR POLAR MODULATION

FIELD OF THE INVENTION

The present invention relates to an electronic device for power efficient linear amplification of radio frequency signals, more specifically to a polar modulation based power amplifier.

BACKGROUND OF THE INVENTION

"Large Signal Polar Modulation" also known as "Envelope Elimination and Restoration (EER)" is generally known and applied for highly efficient linear power amplification of radio frequency (RF) signals having modulated amplitudes and phases. The basic principle of large signal polar modulation is well known in the art. The amplitude and phase modulated radio frequency signal is split into a constant amplitude radio frequency signal containing the phase information (PM) and a low frequency signal representing the amplitude information (AM). The constant envelope radio frequency signal is subsequently amplified in a high-efficiency non-linear amplifier. The signal is reconstructed again by collector modulation (or drain modulation dependent on the technology) of the final amplifier stage or stages by the low frequency signal representing the amplitude information. This is typically achieved by driving the final stages into compression such that the amplitude of the radio frequency signal passing through the amplifier stage is actually determined by the low frequency collector voltage (or drain voltage).

It is well known in the art that the linearity of a large signal polar power amplifier is limited by the imperfections during reconstruction of the output signal. During reconstruction, the amplitude modulated component AM and the phase modulated component PM have to be recombined in order to constitute an amplified version of the input signal. An ideal polar power amplifier would only change the amplitude of the amplified phase modulated radio frequency signal as function of the AM signal. However, in practical implementations, the AM signal affects also the phase of the amplified phase modulated radio frequency signal. This imperfection is quantified as the "AM2PM" transfer characteristic. The AM2PM defines the amount of undesired phase modulation due to the amplitude modulation during the signal reconstruction process. A second important characteristic is the amplitude-to-amplitude distortion which is usually denoted as "AM2AM". AM2AM quantifies the relationship between the baseband envelope signal and the envelope of the radio frequency output signal. The deviation of the two envelope signals is due to distortion in the amplitude modulation process for example caused by a non-linear relationship between the collector (or drain) voltage and the envelope of the radio frequency output signal.

A major disadvantage of the conventional collector modulation (or drain modulation) approach consists in the limited linearity of the radio frequency power amplifier. The limited linearity impairs the dynamic range, i.e. the maximum range of the amplitude over which high linearity of the amplifier can be maintained. The upper limit of the linear range is typically limited by the supply voltage (e.g. battery supply voltage). The lower limit is defined by the minimum collector voltage (or drain voltage) of the amplifying transistors. Above the minimum collector (or drain) voltage, the undesired phase variation due to the AM signal applied to the amplifying transistor stages is still within the linearity limits. Below the minimum value the transistors show non-linear behavior, thereby introducing phase variation due to the AM signal causing distortion in the signal to be amplified. Another aspect that impairs the dynamic range is the reduced isolation of the radio frequency amplification stages. The lower limit of the amplitude of the output signal is determined by the attenuation of the constant envelope input signal by the power amplifier in the case that the AM control signal is set to its minimum value. The amplifier isolation is limited in this case by the parasitic capacitances of the switched-off transistors.

As the supply voltages decrease and modulation schemes become more complex for today's and future mobile low power applications, the requirements relating to linearity, noise and dynamic range of amplifiers become more and more relevant. For mobile equipment a typical battery supply voltage amounts to 3 V. A power amplifier using bipolar radio frequency devices provides a minimum useful collector voltage of not less than 0.3 V. This results in a maximum dynamic range of approximately 20 dB. However, the modern cellular systems require more than 40 dB of total dynamic range in order to cover the amplitude range of the modulating signal over the full range of average output power. The conventional approach to cope with these high dynamic range signals consists in a phase and/or amplitude pre-distortion in order to compensate the phase and/or amplitude distortion during the amplification and reconstruction process. However, this approach has a number of important disadvantages. The pre-distortion or pre-correction methods are either not applicable in certain operating conditions or at least not useful to compensate deviations in frequency, drive power, temperature, antenna impedance and supply voltage. Generally, the pre-distortion principles are not attractive for large dynamic range systems that cannot be compensated by (e.g. digital) pre-correction methods, as those methods are not sufficiently robust or not practical. Further, the conventional approach requires a complex design and additional calibration procedures during production if they are applied in combination with (e.g. digital) pre-distortion methods. This results in additional costs and in an increased time to market.

SUMMARY OF THE INVENTION

It is an object of the present invention to provide an electronic device for linear power amplification of radio frequency signals with a greater dynamic range and improved linearity.

According to the first aspect of the invention an electronic device for power efficient linear amplification is provided. The electronic device includes an amplifier for amplifying a phase modulated signal. The amplifier is adapted to be controlled by a first modulating signal for modulating the amplitude of the phase modulated signal above a predetermined amplitude value. The electronic device is further adapted to attenuate an output signal of the amplifier for providing amplitude modulation below the predetermined amplitude value. According to this aspect of the invention, the amplitude modulation range of the amplitudes is split into at least two ranges. Amplitudes greater than a specific level are generated by modulation of the power amplifier by a first amplitude modulating signal. This kind of modulation is only applied above a predetermined value within a first amplitude range. The value is preferably determined such that the amplifier is substantially linear in the first range of modulation. Smaller amplitudes being lower than a specific level are produced by attenuating an output signal of the amplifier. Instead of amplifying the output signal in the amplifier over the whole range, one or more specific portions of the output amplitude range are provided by an amplification stage and an attenuation stage, wherein the amplified signal is attenuated. According to this aspect of the invention, the overall linearity can be improved, since attenuating the signal for smaller values can be implemented by use of more linear devices than amplifying by the transistors. Further, as the output signal of the amplifier is attenuated, all signal components included in the output signal are attenuated, too. The signal to noise ratio of the amplifier that is provided above the predetermined value is basically maintained. The consequence is an increased dynamic range over the full output amplitude range.

The concept described here above is not only beneficial for polar modulation based power amplifiers, but also for extending the dynamic range for linear amplification using non-linear components (LINC) amplifiers. For LINC amplifiers, the accurate amplitude modulation is limited at low levels due to the fact that low levels are created by adding large amplitude signals at the output, which are almost out of phase, i.e. close to 180° phase difference. The modulated attenuator as described with respect to this aspect of the invention can be used to limit the dynamic range that needs to be covered by the LINC amplifier. Accordingly, the low level modulation is provided by the modulated attenuator behind the amplifier.

The concept according to the present invention is preferably applied for low signal levels. This is due to the fact, that power efficiency of the power amplification process is less relevant for small amplitudes. As the amplifier is driven at higher amplitude level, i.e. a higher amplification factor, which is attenuated only afterwards, a certain amount of energy is wasted. This is less relevant, if the fixed level, at which the amplifier is held, is small. At high power levels, the principle according to this aspect of the present invention profits from the good efficiency offered by polar modulation or the LINC architecture.

According to another aspect of the invention, the electronic device includes a modulated attenuator for attenuating the output signal of the amplifier in response to a second modulating signal. The second modulated signal is used to control the amplifier for smaller amplitudes below the predetermined value. This aspect of the present invention relates to a preferred implementation, where the attenuation is realized in a separate modulated attenuator. This attenuator is implemented independently from the amplifier. According to a further aspect of the invention, the modulated attenuator can include a PIN-diode, which is coupled to the output of the amplifier. The PIN-diode is driven by the second modulating signal and provides the necessary attenuation. This aspect of the invention implements a simple and effective attenuation of the output signal. The resistance of the PIN-diode and the corresponding attenuation of the matching network containing the PIN-diode at the RF operating frequency of the power amplifier is determined by the value of the low frequency current passing through the PIN-diode device. Amplitude modulation is achieved by converting the second modulated signal to a low frequency signal current through the PIN-diode. Linear modulation requires that the transfer function of the converter is such that the relation between PIN-diode RF resistance and the magnitude of the second modulated signal is linear.

According to still another aspect of the invention, the components of the above mentioned electronic device are adapted to provide a continuously modulated amplitude range over the whole range of the first amplitude modulating signal and the second amplitude modulating signal. As there are two amplitude ranges being controlled by two different control signals, this aspect of the invention assures that the two ranges join each other at the predetermined value, such that a smooth transition is established.

According to another aspect of the invention, the electronic device includes a limiter for extracting the phase modulated signal of an input signal, wherein the phase modulated signal contains the phase information of the input signal and an envelope detector for extracting the envelope signal of an input signal, wherein the envelope signal comprises the amplitude information of the input signal. This aspect of the invention relates to polar modulation. The components used for a large signal polar modulation and amplification are combined in an advantageous manner with the amplifier and the attenuator described above. The overall linearity and the dynamic range is improved by using the principle and the configuration according to the present invention. Further, the characteristics AM2AM and AM2PM are considerably improved for a large dynamic range polar modulator according to one or all of the above mentioned aspects of the invention. This is due to the improved linearity of the attenuator for small amplitudes. The distortion and the noise, which are conventionally contributed by the amplifier for smaller amplitudes, are avoided. The radio frequency amplifier is only used in a range, in which its linearity is appropriate. For any range for which linearity and distortion of the amplifier are not sufficient, the output of the amplifier is stuck to an upper, fixed output amplitude value, and the smaller amplitudes are provided by attenuating the fixed value. This principle may be applied for one amplitude range, but also for several amplitude ranges in a piecewise manner.

According to an aspect of the invention, the electronic device comprises further an amplifier for providing the first modulating signal, being coupled such that the first amplitude modulating signal remains at a predetermined amplitude value, if the envelope signal drops below a specific level. The amplifier is preferably implemented as a voltage follower by use of an operational amplifier. The limitation for output levels below a specific value can be implemented by a fixed voltage level being coupled via a diode to the positive input of the voltage follower. This concept provides a smooth transition between the amplitude ranges.

According to an aspect of the present invention, the attenuation is carried out by an antenna switch being adapted to serve as an attenuator. According to this aspect of the invention, a component, which is usually present for example in cellular phones, i.e. cellular front end modules, is reused as the variable attenuator according to the present invention. Accordingly, the present invention is not limited to any specific diode element as long as the device used for attenuation is appropriate to attenuate the output signal in response to a low frequency control signal. If the antenna switch is not used for switching, then the element can be used as a variable resistor if properly biased and controlled. The attenuation of for example a MOS or pHEMT device in the linear region can be modulated by modulating the gate voltage of the device. In response to the applied gate voltage level, the amplitude is attenuated. As a device is used, which is already present, this approach is useful to save complexity and costs of the circuit.

The object of the present invention is also solved by a method including the steps of controlling an amplifier by a first modulating signal for modulating the amplitude of the phase modulated signal as long as the output amplitude is greater than a predetermined amplitude value for providing output amplitudes above the predetermined value, and holding the output of the amplifier at the predetermined amplitude value on a constant level, and attenuating the output signal of the amplifier being held on the constant level for providing amplitudes below the predetermined amplitude value. Accordingly, an important aspect of the present invention resides in the attenuation of a fixed output signal of the radio frequency amplifier. The concept according to this aspect of the invention is applicable to numerous different amplifying concepts as for example class AB, class E, class F, and class D amplifiers. It is basically also conceivable to compose an output signal of an amplifier in a piecewise manner, such that one or more regions of the output signal are provided by attenuation rather than amplification.

BRIEF DESCRIPTION OF THE DRAWINGS

These and other aspects of the invention will be apparent from and elucidated with reference to the embodiments described hereinafter. In the following drawings

DETAILED DESCRIPTION OF THE EMBODIMENTS

Figure 1:
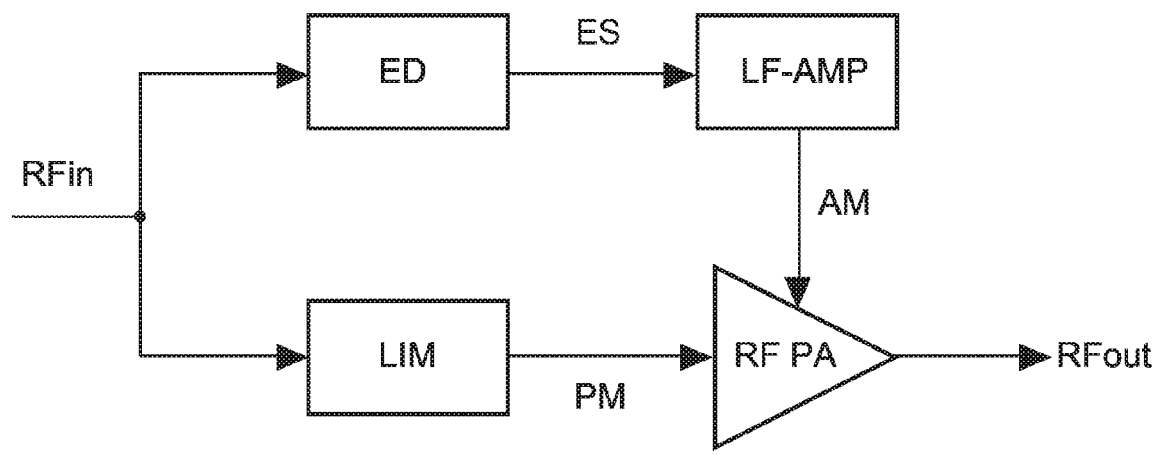
FIG. 1 shows a simplified block diagram of a polar modulation based amplifier according to the prior art.

FIG. 1 shows a simplified block diagram of a prior art polar modulator. The radio frequency input signal RFin is supplied to an envelope detector ED and a limiter LIM. The limiter LIM extracts from the input signal the phase modulated component PM suppressing thereby the amplitude information. The amplitude of the phase modulated signal PM is constant. The envelope detector ED extracts from the input signal an envelope signal ES and passes the envelope signal ES to a low frequency amplifier LF-AMP. The envelope signal ES contains the amplitude information of the input signal RFin. ES is amplified by the low frequency amplifier LF-AMP, which provides an amplitude modulating signal AM to the radio frequency power amplifier RF-PA. Signal AM is used to control the radio frequency amplifier, i.e. the amplitude of the output signal RFout of the amplifier RF-PA. By modulating the phase modulated component PM by the amplitude modulated component AM, the phase modulated component PM and the amplitude modulated component AM are recombined in the radio frequency power amplifier RF-PA. The combined output signal RFout is an amplified version of the input signal RFin.

The radio frequency power amplifier RF-PA is a power efficient non-linear amplification stage, which is conceived to amplify the phase modulated input signal. In order to add the amplitude information to the phase modulated signal, the supply voltage of at least a part of the radio frequency power amplifier RF-PA is changed in accordance with the amplitude component AM. The output signal RFout is the amplified polar modulated input signal RFin. The main disadvantage of the configuration shown in FIG. 1 is the limited linear dynamic range of the radio frequency power amplifier RF-PA. The upper limit of the amplification range is defined by the supply voltage. The lower limit is determined by the minimum voltage across the amplifying devices and the limited RF isolation of the devices. These are usually transistors arranged in a common emitter configuration and operated in compression. The collectors of the transistors used for amplifying the signals provide the amplified output signals for the next stage. The voltage across the transistors must remain above a minimum value. Below this minimum value the transistor leaves the region in which the collector (or drain) supply voltage accurately determines the RF envelope without affecting the phase of the RF-signal. The consequence of the limited linear range, i.e. the limited linearity is a distortion of the amplitude and the phase of the output signal. In order to improve the implementation shown in FIG. 1 the present invention suggests a configuration as the one shown in FIG. 2.

Figure 2:
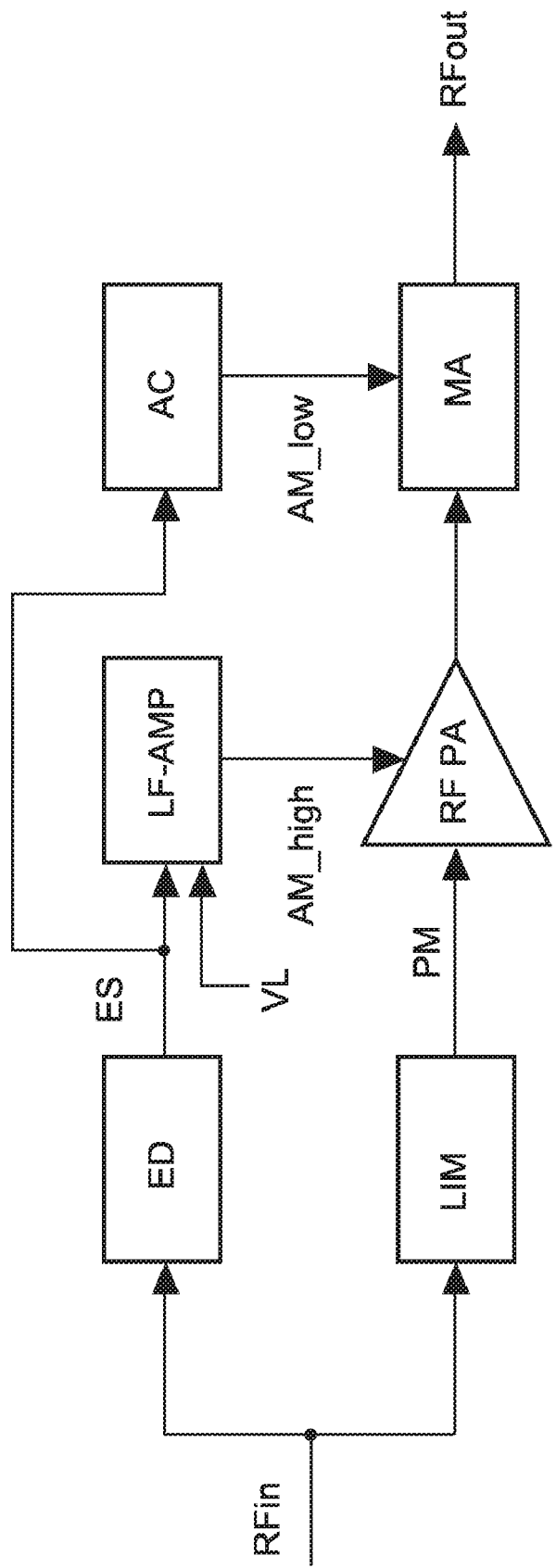
FIG. 2 shows a simplified block diagram of a polar modulation based amplifier principle according to an embodiment of the invention.

FIG. 2 shows a simplified block diagram of a first embodiment of the present invention. Accordingly, there is a radio frequency input signal RFin applied to an envelope detector ED and a limiter LIM. The limiter LIM produces the phase modulated RF signal PM representing the phase modulating component of the input signal RFin. The output signal ES of the envelope detector ED is applied to the low frequency amplifier LF-AMP. According to this embodiment of the invention the low frequency amplifier LF-AMP generates an output signal AM_high which is applied to the radio frequency power amplifier RF-PA for modulating the phase modulated input signal PM. The low frequency amplifier LF-AMP receives also a limiting signal VL indicating the lower limit of the modulating range over which the low frequency amplifier LF-AMP provides the modulating amplitude signal AM_high. Accordingly, the amplitude modulating signal AM_high is fixed to a predetermined value for a specific voltage range below VL. These small modulating amplitudes are provided by the attenuator control circuit AC and the modulated attenuator MA. The output of the envelope detector ED is also applied to the attenuator control block AC. This block produces an output signal AM_low which is used to control a modulated attenuator. The amplitude modulated signal AM_low is only active for amplitudes smaller than the pre-determined value VL. Accordingly, the complete range of amplitude modulation is split into two parts, a first part, which is controlled by AM_high, and a second part, which is controlled by AM_low. AM_high is used for amplitude modulation in accordance with the conventional principle as described above with respect to FIG. 1. For amplitudes, which are smaller than a value indicated by VL, AM_low is used. AM_high provides that the output signal of the amplifier RF-PA sticks to a minimum value for all amplitudes below the minimum value indicated by VL. The smaller amplitudes are only modulated by AM_low. Further, the small amplitudes are not amplified according to the conventional principle. Instead, a modulated attenuator MA is used to decrease those amplitudes. The power amplifier outputs only a phase modulated signal with a constant amplitude. This constant output signal is then further decreased by attenuation. Dependent on the specific configuration the attenuator is implemented, attenuation can be much more linear than amplification. Additionally, the noise that is introduced in the "frozen" output signal of the power amplifier will be attenuated by the same amount as the amplitude of the output signal, if the output signal is reduced. This results in an increased dynamic range. Above the specific minimum value, which can be pre-determined deliberately by the input signal VL, the conventional principles of modulating the supply voltage of the radio frequency power amplifier RF-PA are applied.

The advantage of this aspect of the invention resides in an improved linearity for the smaller amplitude values and an improved signal-to-noise ratio for smaller amplitudes, which result both in an improved dynamic range. Accordingly, the characteristic AM2AM is improved. Further, if properly implemented, the phase of the output signal, i.e. the characteristic AM2PM, is also less affected. According to this aspect of the invention, the attenuator is suitable to provide a better linear relationship between the modulating signal AM_low and the output signal RFout. The combined overall linearity of the polar modulating power amplifier PA is substantially improved providing a better signal-to-noise ratio over the whole dynamic range required for modulation and power control.

Figure 3:
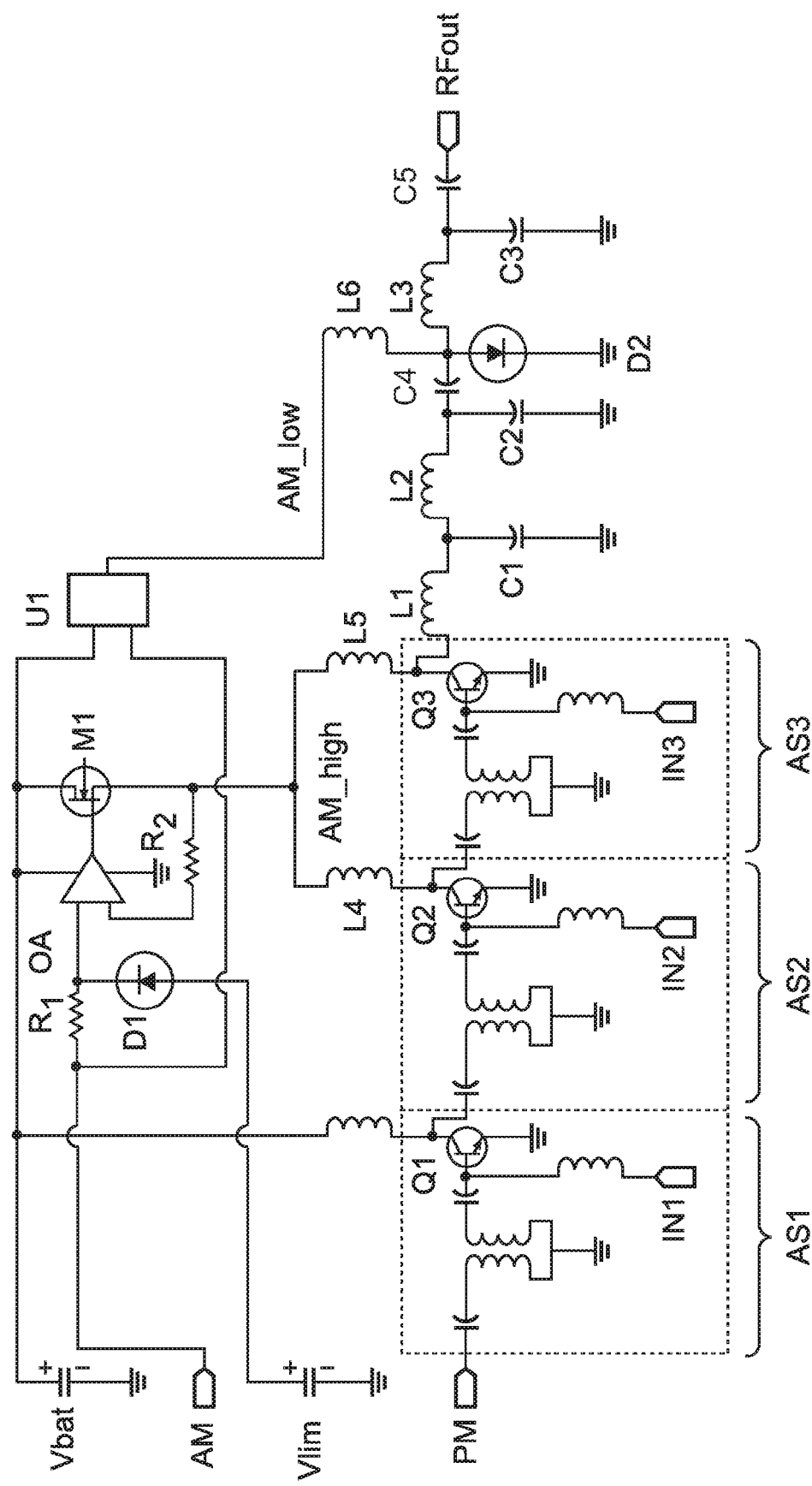
FIG. 3 shows a schematic of a circuitry of a polar modulation based amplifier according to an embodiment of the present invention.

FIG. 3 shows a simplified schematic of an embodiment of a polar based power efficient linear amplifier according to the present invention. The limiter LIM and the envelope detector ED are not shown in FIG. 3. The amplitude modulated component AM, which is supposed to be produced for example by an envelope detector, is supplied as an input signal to the input pin AM of the upper part of shown circuitry. The phase modulated component PM being generated for example by a limiter as explained with respect to FIG. 1 and FIG. 2 is applied to the lower part of the circuitry consisting of cascaded three common emitter (CE) amplifier stages AS1, AS2 and AS3. These stages comprise some decoupling capacitors and inductors and one transistor Q1, Q2, and Q3 per stage. Although the following description refers basically to the notation used for bipolar transistors, the invention is not restricted to any particular technology. So, the transistors Q1 to Q3 of the stages AS1, AS2, and AS3 might be implemented as bipolar transistors or as Metal Oxide Silicon Field Effect Transistors (MOSFET) or Heterojunction Bipolar Transistor (HBT) transistors. The collector of the transistor of each stage is coupled to the respective following stage. The amplification stages AS1 to AS3 are followed by three matching L-sections comprising each an inductor L1, L2 or L3 and a respective capacitor C1, C2, C3, C4, or C5. The amplitude modulation for large signal levels is supplied via the control signal AM_high being coupled to stages AS2 and AS3 via inductors L4 and L5. The input pins IN1, IN2, and IN3 are used to apply the base (gate) bias for the transistors, such that the stages AS1, AS2, and AS3 are properly adjusted in order to operate as class AB amplifiers. The biasing as such is usually kept constant over time. However, the present invention is not limited to a specific kind of amplifier classes. Accordingly, other operating classes like for example class D, class E, and class F may also be used. The final stages of the amplifiers are driven into saturation. In the saturated state, the amplitude of the radio frequency envelope signal passing through the amplifier stages is determined by the low frequency collector (or drain) voltage. However, as apparent from the above explanations, according to some important aspects of the present invention, there might be other concepts to modify the amplitude of the phase modulated signal which are also susceptible to the present invention, as the combination of amplification and attenuation is beneficial independently from the specific type of amplifier.

The amplitude modulation component AM is supplied to an operational amplifier OA which is arranged as a voltage follower. The output stage of the voltage follower includes a MOS transistor M1 which is adapted to provide a high output current as amplitude modulating signal AM_high. The operational amplifier OA further includes a diode D1 being coupled to the positive input of the operational amplifier. Via diode D1 a limiting voltage Vlim defines the lower limit of the amplitude range. For this range the operational amplifier OA provides the amplitude modulating signal AM_high. If the input signal AM to the operational amplifier stage OA drops below the limiting voltage Vlim, the output voltage AM_high will remain at the minimum value Vlim. The amplitude modulation component AM is also applied to a voltage to current converter UI. Accordingly, the amplitude modulation signal is converted into a current to be used for low amplitude levels. AM_low is supplied as the supply current of diode D2. Diode D2 may preferably be a PIN-diode (PIN=Positive, Intrinsic, Negative). As already explained above, the resistance of PIN-diode D2 and the corresponding attenuation of the matching stages at the RF operating frequency of the power amplifier depends on the amount of low frequency current passing through the PIN-diode D2. The amplitude of the output signal is modulated by the signal AM_low, which is in the present embodiment a low frequency signal current through the PIN diode D2. In order to achieve a linear modulation, the transfer function of the converter must provide a linear relation between the radio frequency resistance of the PIN diode D2 and the magnitude of the second modulated signal AM_low. Accordingly, an output characteristic of the output signal RFout is achieved as described above with respect to FIG. 2. The characteristic of the high level AM transfer as defined by signal AM_high and limiting voltage Vlim, and the low level AM transfer as defined by AM_low are aligned such that a smooth AM2AM and AM2PM characteristic is obtained as a function of the input signal AM. The smooth transition is a crucial aspect of the whole application in order to prevent phase and amplitude errors during transitions between high level modulation and low level modulation in the modulation cycle.

It is understood by a person skilled in the art that the concepts described here above, and in particular the implementation example shown in FIG. 3 are susceptible to a number of modifications regarding the number and arrangement of amplification stages and the implementation of the modulated attenuator. As for the attenuator, the following modifications are conceivable. A different number of output matching stages and the application of the low level modulation to a different number of matching stages might be used. Further, it is possible to use L-, PI-, or T-networks of attenuators instead of a single shunt device to achieve a more stable load impedance for the power amplifier as a function of the power level. This approach will further improve the AM2AM and AM2PM characteristics. Still further, it is possible to apply a GaAs pHEMT (Gallium Arsenid pseudomorphic High Electron Mobility Transistor) as a variable attenuator. According to an aspect of the present invention, it is possible to reuse the pHEMT antenna switch, which is usually present in numerous cellular front-end modules, such as the variable attenuator according to the present invention. Still another alternative consists in using a MOS transistor, which operates in the linear region, as a variable attenuator. As to the amplification stages (also called the radio frequency Line Up), the use of a different number of stages and the application of the high level modulation to a varying number of amplification stages is possible. It is also possible to implement the amplifier according to the present invention rather as a differential (symmetric) circuit instead of using the single ended topology shown in FIG. 3. Besides, it will be appreciated by the persons skilled in the art that it is generally possible to use field effect transistors (FET) instead of bipolar junction transistors (BJT) as radio frequency devices.

Figure 4:
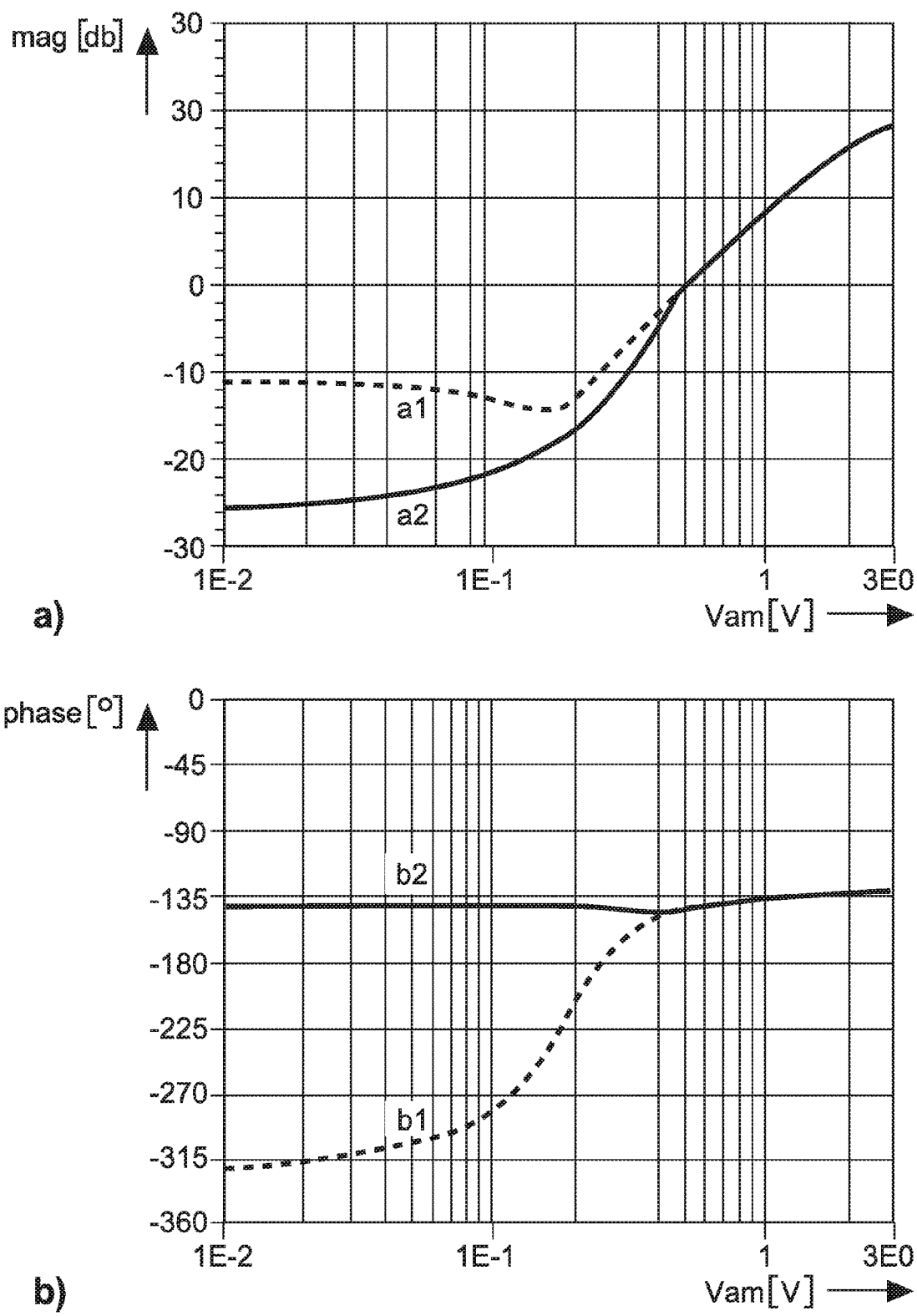
FIG. 4 shows the amplitude and phase diagrams for polar modulators according to an embodiment of the prior art and an embodiment according to the present invention.

FIG. 4 shows the phase and amplitude characteristics of the conventional solution compared to the characteristics of the solution according to an embodiment of the present invention. Accordingly, a comparison of the typical AM2AM and AM2PM characteristic of a conventional and the proposed high dynamic range concept for a 3V, 30 dBm bipolar silicon power amplifier is shown in FIG. 4. The performance of a conventional concept as described with respect to FIG. 1 is indicated by dotted lines a1 and b1, whereas the concept according to an embodiment of the present invention is indicated by lines a2 and b2. According to FIG. 4(a), the amplitude-to-amplitude range (AM2AM) of the conventional concept is limited to 35 dB. This restriction is due to the limited isolation of the amplifier stages compared to the embodiment of the present invention. The embodiment according to the present invention achieves about 45 dB AM2AM. As could be depicted from FIG. 4(a), the improved AM2AM range is realized for smaller input values. Accordingly, the positive effect is achieved by the attenuator for small signal amplitudes. Further, as indicated in FIG. 4(b), the embodiment according to the present invention achieves less than 20° phase distortion compared to more than 100° of the conventional concept. This aspect of the invention is particularly advantageous, as the reduced amplitude-to-phase distortion eliminates the need for phase pre-distortion for GSM EDGE operation.

Further, it will be appreciated by those skilled in the art that the concept of a modulated linear attenuator as described here above with respect to the present invention can also be used for linear amplification using non-linear components (LINC), which is also known as Chireix or outphasing. As for various different amplification concepts, the accurate amplitude modulation used by LINC is also limited at low levels due to the fact that low levels are created by adding large amplitude signals at the output, which are almost out of phase (i.e. they are close to 180° phase difference). Accurate modulation requires very precise control of a phase difference between the two output signals used for LINC. The modulated attenuator as described here above with respect to the present invention could be used to delimit the present range, which is to be covered by the LINC amplifier. The low level modulation might then be provided by the modulated attenuator succeeding the amplifier.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims the word "comprising" does not exclude other elements or steps, and the indefinite article "a" or "an" does not exclude a plurality. A single amplification stage, transistor or the like or other unit, may fulfill the functions of several items recited in the claims and vice versa. The mere fact that certain measures are recited in mutually different dependent claims does not indicate that a combination of these measures cannot be used to advantage. Any reference signs in the claims should not be construed as limiting the scope.

The invention claimed is:

1. Electronic device for power efficient linear amplification, comprising an amplifier for amplifying a phase modulated signal, the amplifier being controlled by a first modulating signal for modulating the amplitude of the phase modulated signal above a predetermined amplitude value, the electronic device being adapted to attenuate an output signal of the amplifier for providing amplitudes below the predetermined amplitude value.

2. Electronic device according to claim 1, further comprising a modulated attenuator for attenuating the output signal of the amplifier in response to a second modulating signal, the modulated attenuator comprising a PIN-diode being coupled to the output of the amplifier, wherein the PIN-diode is further driven by the second modulating signal.

3. Electronic device according to claim 2 further adapted to provide a continuously modulated amplitude range over the whole range of the first amplitude modulating signal and the second amplitude modulating signal.

4. Electronic device according to claim 1, further comprising a limiter for extracting the phase modulated signal the input signal, wherein the phase modulated signal comprises the phase information of the input signal and an envelope detector for extracting the envelope signal of an input signal, wherein the envelope signal includes the amplitude information of the input signal.

5. Electronic device according to claim 1, further comprising an amplifying stage for providing the first modulating signal, the electronic device being coupled such that the first amplitude modulating signal remains at a predetermined amplitude value, if the envelope signal drops below a specific level.

6. Electronic device according to claim 1, wherein the attenuation is carried out by an antenna switch, the switch being biased and controlled for acting as a variable resistor for being used as an attenuator for attenuating the output signal of the amplifier.

7. Method for power efficient linear amplification comprising the steps of:
controlling an amplifier by a first modulating signal for modulating the amplitude of a phase modulated signal, for providing output amplitudes greater than a predetermined amplitude value,
holding the output of the amplifier at the predetermined amplitude value on a constant level, and attenuating the constant output signal of the amplifier for providing amplitudes below the predetermined amplitude value.

* * * * *